United States Patent [19]

Quiros et al.

[11] Patent Number: 4,659,941

[45] Date of Patent: Apr. 21, 1987

[54] POWER SENSING DEVICE

[75] Inventors: Jaime J. Quiros, Mesa, Ariz.; John G. Pennett, Monument, Colo.

[73] Assignee: The United States of America as represented by the Secretary of the Air Force, Washington, D.C.

[21] Appl. No.: 756,549

[22] Filed: Jul. 19, 1985

[51] Int. Cl.⁴ .......................................... H03K 17/00
[52] U.S. Cl. ........................................ 307/11; 307/39; 307/252 B; 307/38
[58] Field of Search .................. 307/11, 28, 29, 34, 307/35, 37, 38, 39, 125, 126, 130, 252 B, 223 B; 361/5, 6, 7, 30, 31, 33, 56, 57, 79, 86, 87, 88, 90, 91, 92, 110, 111, 187

[56] References Cited

U.S. PATENT DOCUMENTS

| | | | |
|---|---|---|---|
| 3,416,001 | 12/1968 | Fistell | 307/38 |
| 3,517,217 | 6/1970 | Sleater et al. | 307/252 B |
| 3,566,198 | 2/1971 | Delahunty | 307/252 B X |
| 3,588,523 | 6/1971 | Grafton | 307/132 R |
| 3,600,635 | 8/1971 | Neilson | 307/39 X |
| 3,603,817 | 9/1971 | Casson | 307/252 B |
| 3,644,755 | 2/1972 | Shaw | 307/252 B |
| 3,648,075 | 3/1972 | Mankovitz | 307/252 B |
| 3,651,335 | 3/1972 | Shimizu et al. | 307/223 B |
| 3,668,422 | 6/1972 | Pascente | 307/252 B X |
| 3,784,840 | 1/1974 | Kirkpatrick | 307/11 |
| 3,868,544 | 2/1975 | Banks | 307/252 B X |
| 3,980,943 | 9/1976 | Cailleux et al. | 307/39 X |
| 4,064,404 | 12/1977 | Willmott et al. | 307/141.4 |
| 4,118,700 | 10/1978 | Lenihan | 307/116 X |
| 4,127,854 | 11/1978 | Gardner et al. | 307/39 X |
| 4,322,632 | 3/1982 | Hart et al. | 307/41 |
| 4,419,589 | 12/1983 | Ross | 307/39 |
| 4,437,018 | 3/1984 | Manley | 307/126 X |
| 4,461,690 | 7/1984 | Rolff et al. | 307/34 X |
| 4,466,039 | 8/1984 | Moran et al. | 361/91 X |
| 4,480,197 | 10/1984 | Hollaway | 307/39 X |

OTHER PUBLICATIONS

"Hi-Fi Auto-Switch" by *Electronics*, Australia, (Mar. 1980), vol. 41, No. 12.

Primary Examiner—William M. Shoop, Jr.
Assistant Examiner—Shik Luen Paul Ip
Attorney, Agent, or Firm—William Auton; Donald J. Singer

[57] ABSTRACT

A power sensing device is disclosed for use with an electrical alternating current (AC) power source, a primary load, and a plurality of secondary loads. The power sensing device detects when the primary load is turned on, and automatically supplies power from the electrical AC power source to the plurality of secondary loads in response thereto. The power sensing device also senses when the primary load is turned off, and removes electrical power from the plurality of secondary loads in response thereto.

1 Claim, 1 Drawing Figure

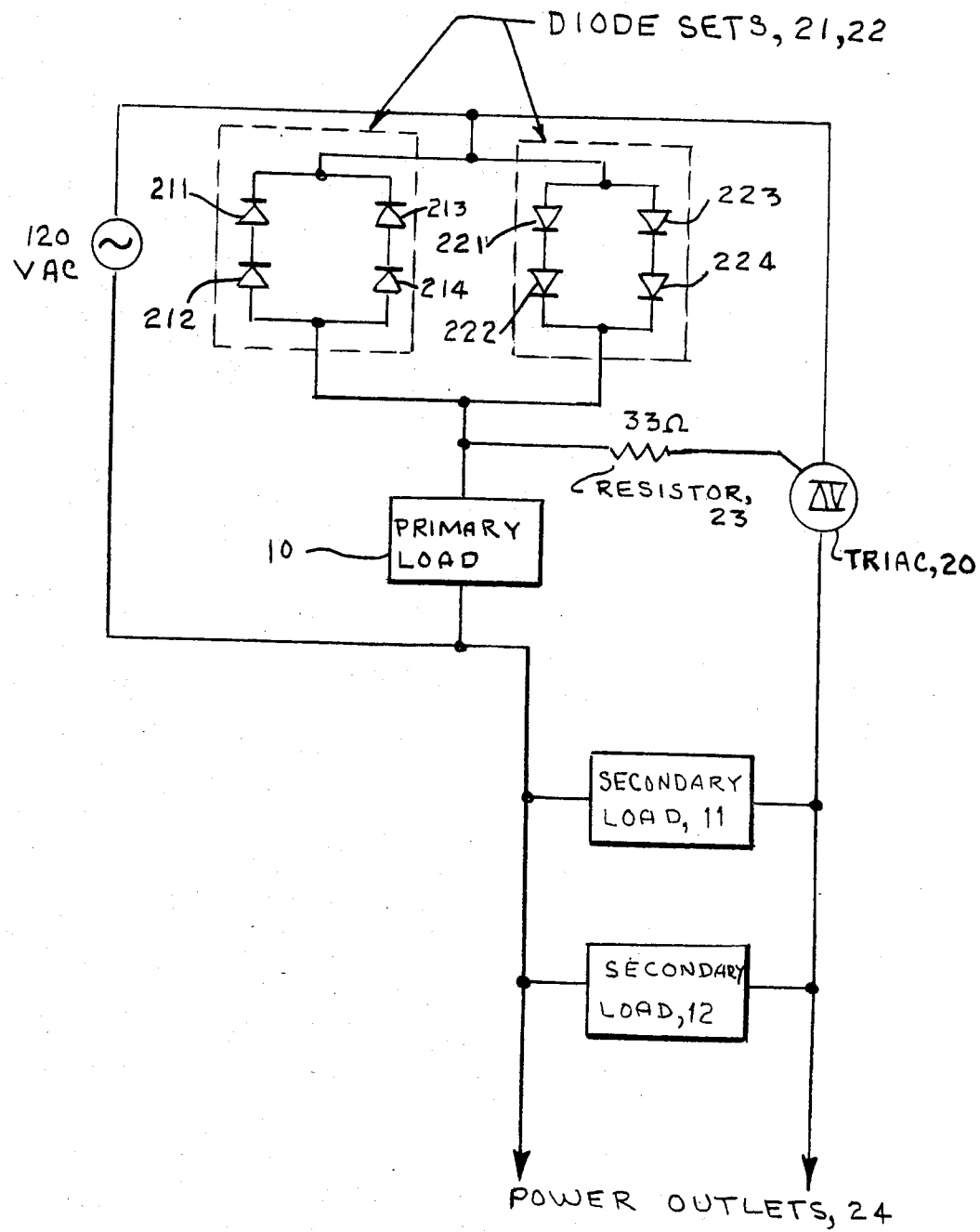

POWER SENSING DEVICE

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to an electrical circuit which supplies power simultaneously to a primary load and a plurality of secondary loads; and specifically to a power sensing device which automatically supplies power to the secondary loads when it senses that the primary load is on, and automatically returns off power to the secondary loads when it senses that the primary load is off.

The purpose of the present invention is to introduce a device (sensor) that will aid in the reduction of waste in different areas in which electricity is used. A potential source of waste occurs when electrical devices are inadvertently left on. The task of enhancing a user's control of electricity so that electrical power is automatically supplied or removed from electrical equipment is alleviated, to some extent, by the following U.S. Pat. Nos., which are incorporated herein by reference:

U.S. Pat. No. 3,603,817 issued to C. F. Casson on 7 Sept. 1971;

U.S. Pat. No. 3,651,335 issued to T. Schimizu et al on 21 March 1972;

U.S. Pat. No. 4,064,404 issued to C. B. Willmott et al on 20 Dec. 1977; and

U.S. Pat. No. 4,322,632 issued to E. F. Hart et al on 30 Mar. 1982.

All of the above references are presented as samples of prior art that use a triac thyristor as a solid state sensing/switching means. The Casson reference discloses a solid state means for selective energization of parallel loads. Schimizu et al disclose an electric circuit for sequentially operating a plurality of AC loads. The Willmott et al reference discloses an accessory for a garage door opener which includes a circuit which is energized when the garage door is operated. The reference of Hart et al includes a circuit for applying power to one or more load devices under control of a remotely located, manually operable switch.

While the references cited above are instructive in the art of solid state sensing and switching devices, the need remains for a design for an automatic means which senses, whether any designated primary load is on or off, and supplies power to as plurality of second loads when the primary load is on, and removes power from the secondary loads when the primary load is off. The present invention is directed towards satisfying that need.

SUMMARY OF THE INVENTION

The present invention is a power sensing device which is electrically connected to: an electrical power source, a primary load, and a plurality of secondary loads. In operation, the invention senses when the primary load is turned on and then automatically provides power to the plurality of secondary loads. When the primary load is turned off, the invention automatically removes electrical power from the plurality of secondary loads.

In one embodiment of the invention, the automatic sensing and switching activities, described above, are accomplished using: two sets of full wave rectifiers (diodes), a bidirectional triode thyristor (triac), a resistor, and a plurality of power outlets. The two sets of diodes are electrically connected in a series circuit with the electrical power source, and the primary load. The two sets of diodes are in a parallel circuit with each other, so that one set only conducts current towards the primary load, and one set only conducts current away from the primary load.

The resistor electrically connects the gate of the triac to the junction between the primary load and the two sets of diodes. The source of the triac is connected to the junction between the two sets of diodes and the electrical power source. The drain of the triac is connected to one terminal of the power outlets. The remaining terminal of the power outlets is connected to the junction between the primary load electrical power source. The power outlets provide an access of electrical power to a plurality of secondary loads, which are all connected to it in parallel with each other. The effect of the above configuration is that when the primary load is turned on the gate of the triac senses a current across the resistor and immediately conducts current from its source to its drain to supply the secondary loads with power. When the primary load is turned off, it becomes effectively an open circuit and the current across the resistor to the gate of the triac drops to zero. When this occurs, the triac removes power from the secondary loads by no longer conducting a current between its source and its drain.

It is a principal object of the present invention to provide a system which is electrically connected to a primary load, electrical power source, and a plurality of secondary sources which automatically supplies power to the secondary loads when the primary load is switched on, and automatically removes power from the secondary loads when the primary load is switched off.

It is another object of the invention to provide a means of conserving energy so that peripheral devices are never inadvertently left on.

It is another object of the invention to provide a means of safety which can control the sequence of activating electrical equipment.

These together with other objects features and advantages of the invention will become more readily apparent from the following detailed description when taken in conjunction with the accompanying drawing.

BRIEF DESCRIPTION OF THE DRAWING

The sole figure of the drawing is a block diagram of the preferred embodiment of the present invention.

DETAILED DESCRIPTION OF THE PREFERRED EMBODIMENT

The present invention is a power sensing device (PSD) which is designed to sense when a certain piece of equipment is turned on or off. When the PSD senses that piece of equipment is turned on it will switch power to additional outlets in a power strip. Conversely, when it senses that that certain piece of equipment is turned off it will switch power to the additional outlets off.

In the drawing, the preferred embodiment of the invention is depicted as a power sensing device which is electrically connected to: an electrical power source of 120 VAC, a primary load 10, and a plurality of secondary loads 11 and 12. The power sensing device is composed of: a triac 20, two sets of diodes 21 and 22, a resistor 23, and a set of power outlets 24.

The two sets of diodes 21 and 22 are electrically connected in a parallel circuit with each other, and in a series circuit with the electrical power source and the primary load 10. One set of diodes 21 is configured to only conduct current away from the primary load, while the other set of diodes 22 only conducts current towards the primary load.

The resistor 23 electrically connects the gate of the triac 20 to the junction between the primary load 10 and the two sets of diodes 21 and 22. The source of the triac is connected to the junction between the two sets of diodes 21, 22 and the electrical power source. The drain of the triac 20 is connected to one terminal of the power outlets 24, and the other terminal of the power outlets 24 is connected to the junction between the primary load 10 and the electrical power source. In the preferred embodiment, the entire power sensing device is actually encapsulated in a power strip which has multiple outlets. The user can determine what equipment is to be a primary load by plugging it into the primary load outlet. The power outlets 24 provide an access of electrical power to the plurality of secondary loads 11 and 12, which are connected to it in a parallel circuit with each other.

In operation, the power sensing device senses when the primary load 10 is on. Then the device provides power to the additional power outlets 24. When the device senses the primary load is turned off, it removes power from the power outlets. This operation is accomplished by the configuration described above as follows. When the primary load 10 is turned on, the gate of the triac 20 senses a current across the resistor 23 and immediately conducts current from its source to its drain to supply the secondary loads 11 and 12 with power through the power outlets 24. When the primary load 10 is turned off, it becomes effectively an open circuit and the current across the resistor 23 and the gate of the triac 20 drops to zero. When this occurs, the triac removes power from the secondary loads by no longer conducting a current between its source and its drain.

The invention, as described above, is capable of virtually limitless applications. For example, in a laboratory one can allow experiments to be controlled from one device. In an office, an entire work station (typewriter, calculator, intercom, etc.) can be controlled by one piece of equipment (the desk lamp). Finally, at home, the system can be used to control a plurality of home entertainment units. All of the above applications entail a convenience and time savings as well as an avoidance of potential waste which can occur when one piece of equipment is inadvertently left on.

Safety considerations are also incorporated with this device. From the above discussion one can deduce that this device can control sequential turn on operation since it will only turn on the additional outlets after the main device is turned on. This feature will prevent the operator from turning on parts of a mechanism that require preceding subsystems to be on, hence it can control the orderly turn on of each subsystem in a given piece of machinery.

These safety applications tie with improved procedures because it frees the user from being forced to take affirmative action to maintain positive control on a sequence of events. This device will allow the sequence to continue only if the required prior steps are taken, hence the user can concentrate on the task at hand rather than thinking of the proper turn on sequence to follow since the device will only allow the correct sequence to continue.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. In combination with an electrical power source, a primary load, and a plurality of secondary loads, a power sensing device comprising:

first and second rectifier means connected in a parallel circuit with each other, said first and second rectifier means being connected in a series circuit with said electrical power source and said primary load;

a plurality of power outlets with a first and second terminal which electrically connects each of said plurality of secondary loads so that they are in a parallel circuit with each other, said first terminal of said plurality of power outlets being electrically connected to a junction where said primary load is connected to said electrical power source;

a resistor with a terminal electrically connected to the junction between said primary load and said first and second rectifier means; and a triac having a source, gate, and drain terminals, its source terminal being the input terminal for the sensing means, its drain terminal being the output terminal of the sensing means, and its gate terminal being electrically connected to said resistor to form the sensing terminal of the sensing means, said triac sensing when said primary load is turned on by detecting a current conducted through said resistor to its gate terminal, said triac conducting current from its source to its drain terminal in response thereto to supply power to said plurality to power outlets, said triac also sensing when said primary load is turned off by detecting an absence of current on its gate terminal, said triac removing power from said plurality of power outlets in response thereto by discontinuing any current flow between its source and drain terminals.

* * * * *